United States Patent [19]

Ninomiya

[11] 4,227,183

[45] Oct. 7, 1980

[54] ANALOG TO DIGITAL CONVERTING DEVICE

[75] Inventor: Yuichi Ninomiya, Kawasaki, Japan

[73] Assignee: Nippon Hoso Kyokai, Tokyo, Japan

[21] Appl. No.: 861,357

[22] Filed: Dec. 16, 1977

[30] Foreign Application Priority Data

Dec. 20, 1976 [JP] Japan .................................. 51/151885
Jun. 1, 1977 [JP] Japan .................................. 52/63184

[51] Int. Cl.² ........................................... H03K 13/175
[52] U.S. Cl. ............................................. 340/347 AD
[58] Field of Search .............. 340/347 AD, 146.3 AG

[56] References Cited

U.S. PATENT DOCUMENTS 4,110,745  8/1978  Ninomiya ..................... 340/347 AD

FOREIGN PATENT DOCUMENTS 2452949  5/1975  Fed. Rep. of Germany ........ 340/146.3 AG

OTHER PUBLICATIONS

Villante "IBM Technical Disclosure Bulletin", vol. 5, No. 6, Nov. 1962, pp. 55-56.
Rackl "IBM Technical Disclosure Bulletin", vol. 15, No. 4, Sep. 1972, pp. 1138-1139.

*Primary Examiner*—Charles D. Miller
*Attorney, Agent, or Firm*—Stevens, Davis, Miller & Mosher

[57] ABSTRACT

In an analog to digital converting device having plural converting stages provided for converting an analog signal to a multi-bit digital signal, the lowest or just preceding converting stages, wherein analog signals to be converted are quantized by minute steps and can be regarded as similar to Gaussian noises, are arranged to form equivalent digital signals. The analog signals are compared with reference levels based on the average level of the analog signals, for instance, alternating components of analog signals are compared with a zero level, hereby improving accuracy of the conversion by minimizing the effect of DC and gain drift.

2 Claims, 17 Drawing Figures

PRIOR ART

ANALOG TO DIGITAL CONVERTING DEVICE

BACKGROUND OF THE INVENTION (1) Field of the Invention

The present invention relates to an analog to digital converting device having high resolvability wherein an analog signal is converted to a multi-bit digital signal by means of quantizing the analog signal by minute level steps.

(2) Description of the Prior Art

In order to perform analog to digital conversion with high resolvability, it is customary to commence the procedure of conversion with the lowest resolvability caused by quantizing the analog signal with use of the most coarse quantizing steps, and then to perform successive procedures of conversion with successively higher resolvability owing to successively finer quantizing steps, those procedures being followed by combining respective results thereof and by appropriate code conversion, so as to form a multi-bit digital signal having the required high resolvability and the desired digit configuration.

An analog to digital converting device provided for effecting the above-mentioned procedures is constructed as a multi-stage converter consisting of at least two analog to digital converting stages, wherein the upper order stages takes shares in the respective procedures relating to the successively lower resolvability, and the lower order stages take shares in those relating to the successively higher resolvability.

The lower the order of the converting stage is, the finer its quantizing step. Accordingly, it is required for the purpose of effecting the analog to digital conversion with sufficiently high accuracy in the lower converting stage, to stabilize the procedure of conversion effected in the upper stages, especially, in the just preceding stage by preventing deterioration in accuracy caused by DC-drift and gain-drift of circuit components contained in those preceding stages. As a result, a conventional multi-stage analog to digital converting device has a complicated configuration for respective converting stages for cancellation of or compensation for the above-mentioned DC-drift and gain-drift of circuit components.

Figure 1:
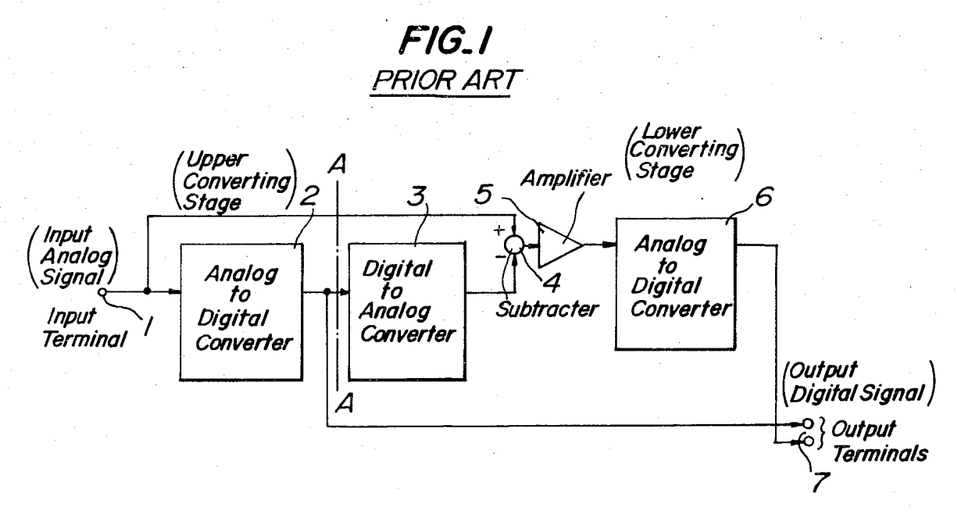
FIG. 1 is a block diagram showing a portion of a conventional multi-stage analog to digital converting device.

FIG. 1 shows a portion, that is, the last and a just preceding converting stage of the conventional multi-stage analog to digital converting device having the high resolvability. In these converting stages, which are separated by a chain line A-A in FIG. 1, an input analog signal, which is applied to an input terminal 1 by a further preceding converting stage, is fed to an analog to digital converter 2 in the upper converting stage, wherein the input analog signal is converted into an upper bit digital signal corresponding to coarse quantizing steps. The upper bit digital signal derived from the converter 2 is applied to a digital to analog converter 3 in the lower stage, wherein the digital signal is reconverted into an analog signal which is equivalent to the upper bit digital signal. The reconverted analog signal is applied together with the input analog signal to a subtracter 4, which develops a differential analog signal from analog signals applied thereto. The differential analog signal derived from the subtracter 4 is applied through an amplifier 5 to an analog to digital converter 6, wherein the differential analog signal is converted into a lower bit digital signal corresponding to the fine quantizing steps. The upper and lower bit digital signals formed respectively as described above are fed together to output terminals 7, where an output digital signal consisting of those signals is derived.

In the configuration mentioned above, it is required that the DC level stabilization of the converters 2 and 3, the subtracter 4 and the amplifier 5 and respective gains of those circuit components be fixed onto respectively prescribed values with extreme stability. Otherwise, the above-mentioned differential analog signal applied from the amplifier 5 to the analog to digital converter varies from a proper level, so that the lower bit digital signal derived from the converter 6 becomes incorrect.

For the purpose of preventing the deterioration of accuracy and stability of conversion, especially the lower bit conversion, caused by the instability of circuit components, and of stabilizing the whole converting device, various kinds of measures have been contrived. However, those measures result in complicated configurations having insufficient accuracy and reliability.

The problems described above are serious and are common to various kinds of multi-stage analog to digital converting devices.

SUMMARY OF THE INVENTION

An object of the present invention is to remove the above-mentioned difficulty commonly shared by various kinds of multi-stage analog to digital converting devices provided with at least two converting stages.

Another object of the present invention is to provide an multi-stage analog to digital converting device having sufficiently high accuracy, resolvability and stability, by virtue of a little more complicated configuration without requiring especially stable circuit components, in comparison with conventional device.

As described in detail later, generally speaking, in far lower order converting stages of a multi-stage analog to digital converting device, wherein the lowest order bit, that is, the least significant bit, or just higher order bits of a multi-bit digital signal obtained by the aforesaid device are formed, wave forms of input analog signals to be converted in that stage can be regarded as those similar to Gaussian noise with respect to a sufficiently long duration compared with the sampling period whereat the input analog signals are sampled, which are distributed evenly on both of upper and lower sides of an average level of those wave forms, which is derived in the aforesaid long duration.

The present invention relates this phenomena in the aforesaid far lower order converting stages, output digital signals having extremely high accuracy and stability can be formed by comparing sampled signal levels of the input analog signal to be converted with reference levels based on the average level of those sampled signal levels.

More particularly, the comparison of signal levels between the input sampled analog signal and the reference signals based on the average level of the analog signal itself is effected in such a manner that the average level derived from the input sampled analog signal is used directly for the comparison, or, alternating components of the input sampled analog signal, which are derived, for instance, from a DC component eliminating circuit applied with the input sampled analog signal, are compared with reference levels based on a zero level.

As a result of the above-mentioned procedure, the analog to digital conversion in the lower order stage can be performed regardless of the DC level of the input sampled analog signal to be converted, so that, even if such a difficulty as DC drift is caused in the preceding stages, the procedure of conversion in the far lower order stage does not suffer at all from the influence of the difficulty caused in preceding stages.

Moreover, in the multi-stage analog to digital converting device, the lower the order of the converting stage, the more minute the level of the analog signal to be converted, so that it is more difficult to ensure a high accuracy for the comparison of signal levels, as is easily understood.

In the conventional analog to digital converting device, the reference levels for the level comparison are supplied from a external stabilized power source, that is, a constant current source, regardless of the analog signal to be converted, whilst in the present invention the reference levels are based on the input analog signal itself. Accordingly, the accuracy of conversion according to the present invention is not deteriorated by instability in the reference levels used for the level comparison.

DESCRIPTION OF THE PREFERRED EMBODIMENTS

Before explaining in full detail the analog to digital converting device according to the present invention, a brief description of the principle of analog to digital conversion upon which the present invention is based is provided. That is, a brief description of the basic property of an analog signal quantized minutely by successively finer quantizing steps, which can be applied for digitizing picture signals, being used, for instance, in the extremely long distance transmission of a television signal, is provided.

Figure 2:
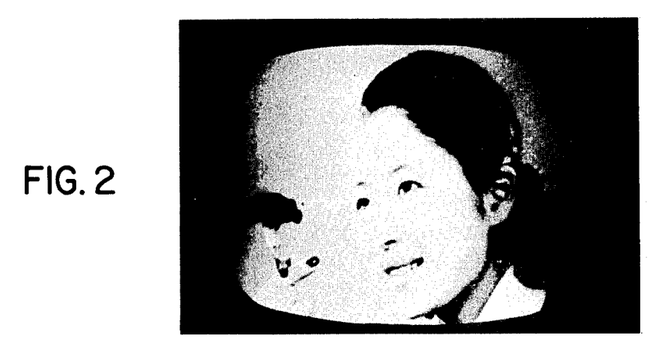
FIGS. 2 to 8 are photographs showing respectively pictures displayed on a picture tube applied with an original analog picture signal to be converted and with analog picture signals reconverted respectively from respective bit digital picture signals obtained by successive converting stages of a multi-stage analog to digital converting device supplied with the original analog picture signal.
Figure 3:
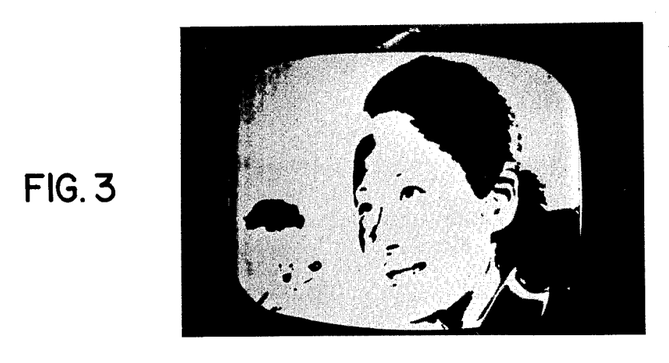
Figure 4:
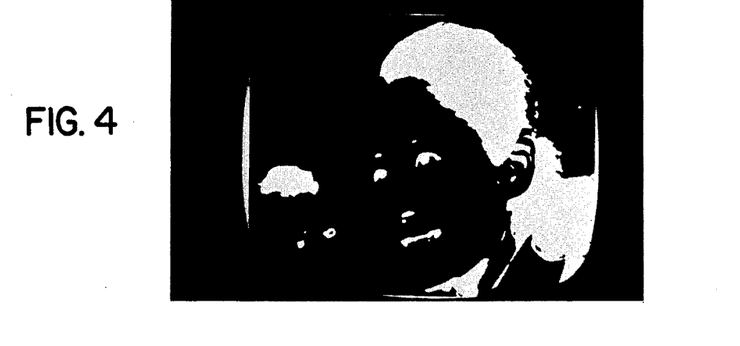
Figure 5:
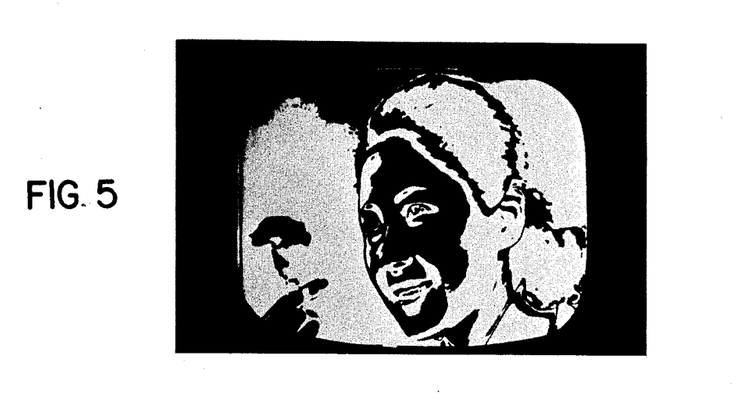

In order to transmit a picture signal corresponding to a picture of high resolution as shown in FIG. 2 in a digital form with sufficiently high resolvability, the analog picture signal must be converted to a digital picture signal consisting of at least eight bits.

When a television picture signal having an amplitude of 1 Vp—p, which corresponds to the standard transmission level of the television picture signal extending from a synchronizing signal level to a white peak level, is quantized for digitizing, it is customary to enlarge the level range of digitizing, that is, a dynamic range of the analog to digital conversion beyond the range of 1 $V_{p-p}$ to, for instance, 1.3 Vp—p. Then the analog picture signal of 1.3 Vp—p can be quantized by referring to successively finer quantizing steps and converted, for example, into an eight bit digital picture signal, respective bits of which are reconverted to such equivalent analog picture signals as shown in FIGS. 3 to 8. The pictures shown in FIGS. 3 to 8 correspond respectively to the first order, that is, the most significant bit (MSB), the second order bit, the third order bit, the sixth order bit, the seventh order bit, and the eighth of the last order, that is, the least significant bit (LSB).

As shown clearly by FIGS. 3 to 8 corresponding to the upper order bits, the outline of the original picture shown in FIG. 2 can be discerned. However, the pictures shown in FIGS. 6 to 8 corresponding to the lower order bits, which show only minute variations of levels of the picture signal, differ extensively from the original picture shown in FIG. 2. The picture shown in FIG. 8 corresponding to the eighth, that is, the last order bit particularly has no trace of the original picture, so that it can be regarded as similar to a picture showing so-called Gaussian noise.

In consequence, the pictures corresponding to the lowest order or immediately higher order bits of a multi-bit digital picture, signal, for instance, the eighth order or seventh order bit of the eight-bit digital picture signal is almost the same statistically as a picture showing digitalized Gaussian noise. In other words, with respect to a certain time duration which is sufficiently longer than sampling periods for quantizing the analog picture signal, which sampling periods correspond to picture elements, for example, a field duration of the television picture, that is, b 1/60 second, the sum total of time durations when the far lower order bits of the multi-bit digital picture signals become a high level "1" and the sum total of time durations when the same bits become a low level "0" are almost equal to each other, as is the case where a digital signal is obtained when Gaussian noise is quantized by referring to two quantizing steps.

Figure 9:
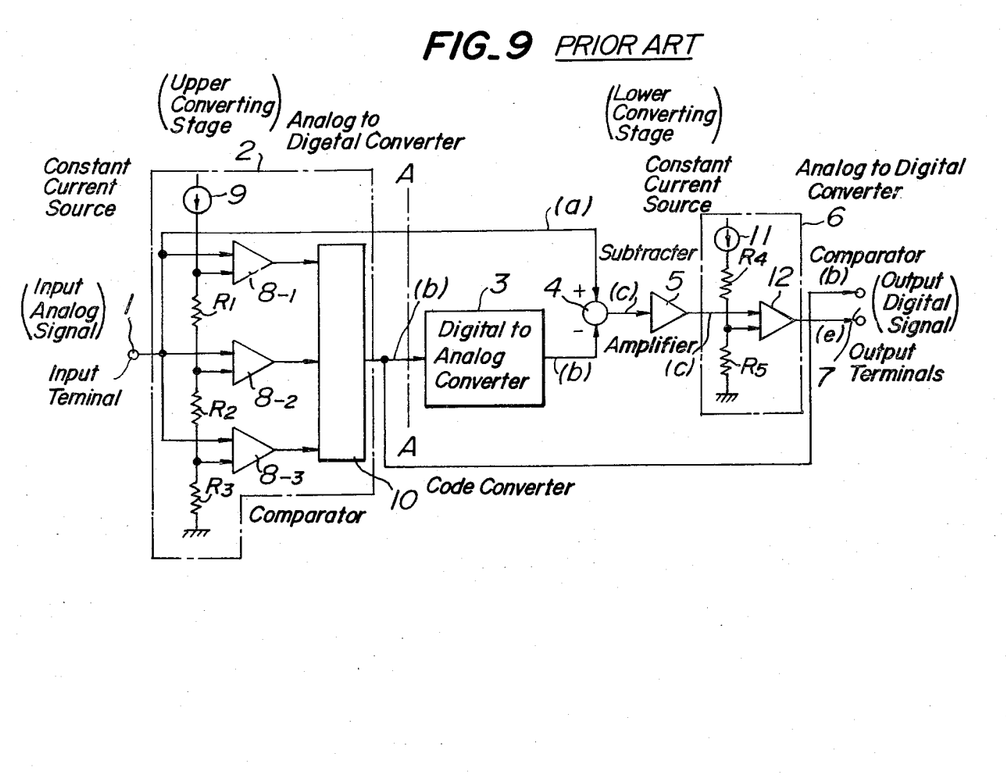
FIG. 9 is a block diagram showing further in detail the portion shown in FIG. 1.

FIG. 9 is a further detailed block diagram showing a portion of the conventional multi-stage analog to digital converting device shown in FIG. 1, in an upper converting stage of which the sixth and seventh order bits of the eight-bit digital picture signal are obtained, and in a lower converting stage of which the eighth, that is, the last order bit of that digital picture signal is obtained.

In the far lower order converting stages of the multi-stage analog to digital converting device as shown in FIG. 9, at a input terminal 1 of an analog to digital converter 2 in the upper stage wherein the sixth and seventh order bits of the desired digital signal are obtained, a differential analog signal between an input analog signal and an equivalent analog signal reconverted from an output digital signal in a just preceding converting stage wherein the fifth order bit of the desired digital signal is obtained is applied from the just preceding converting stage.

Various examples of waveforms of the above-mentioned differential analog signal are shown in an upper row A of FIG. 11, which is explained later.

The differential analog signal at the input terminal 1 is applied in parallel to respective ones of input terminals of three comparators 8-1, 8-2 and 8-3 arranged in parallel, which consist in the analog to digital converter 2.

The respective reference signals having respective levels corresponding to quantizing steps used for digitizing in the upper converting stage, which reference signals are applied to respective another of the input terminals of those comparators are derived as DC potentials from respective connection points of a ladder of resistors $R_1$, $R_2$ and $R_3$, which are connected in series with each other and with a constant current source 9, so as to supply the ladder of resistors with a constant current.

Figure 6:
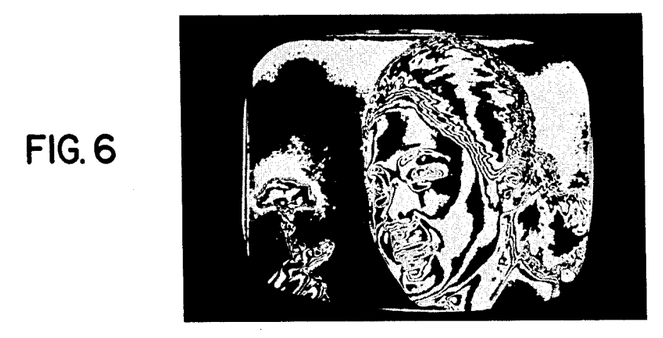
Figure 7:
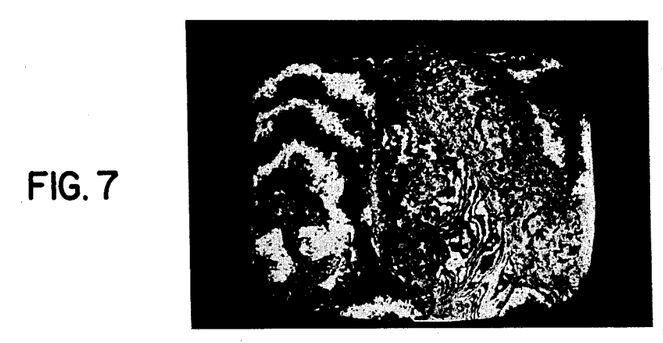
Figure 8:
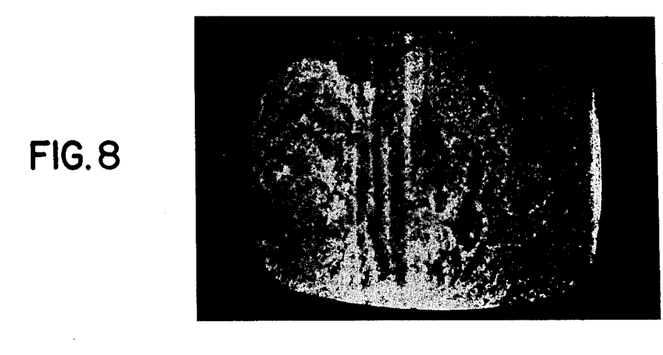

As a result of level comparison effected respectively by the comparators 8-1, 8-2 and 8-3 between the input analog signals (a) and the aforesaid reference signals, a digital signal of quadal one figure is derived in parallel from those comparators and is applied to a code converter 10, so as to be converted into a digital signal of binary two figures, that is, a two bit digital signal, each bit of which corresponds respectively to the sixth and the seventh bits of the desired digital signal as shown respectively in the pictures of FIGS. 6 and 7. The digital signal of binary two figures is supplied to output terminals 7 as a portion of the desired digital signal, and is applied to a digital to analog converter 3 in the lower stage, so as to be converted into an equivalent analog signal consisting of four discretely successive level steps as shown by waveforms (b) in FIG. 11A. The input analog signal (a) and the equivalent analog signal (b) are applied to a subtracter 4, so as to obtain a differential analog signal between those applied analog signals as shown by waveforms (c) in FIG. 11B. The differential analog signal (c) consists of waveforms as shown in FIG. 11B, respective discrete segments of which relate to the aforesaid four level steps respectively and are distributed on both sides of an average level of those waveforms in a well balanced state, which state can be regarded as almost the same to the Gaussian distribution.

In the conventional multi-stage analog as digital converting device, the above-mentioned peculiar property of the input analog signal to be converted in the far lower converting stage has not been noticed at all, and therefore has not been utilized for the procedure of conversion. Accordingly, in the conventional device, the procedure of conversion in those far lower stage is performed in almost the same manner as in the preceding higher stages.

In the conventional configuration shown in FIG. 9, as first discussed, the conversion in the lower stage is effected in almost the same manner as in the upper stage. That is, the differential analog signal (c) derived from the subtractor 4 is applied to an analog to digital converter 6 in the lower stage through an amplifier 5, wherein the differential analog signal which has too minute an amplitude for accurate level comparison is offered with an appropriate amplitude. In the converter 6, the amplifier input analog signal is applied to one of the input terminals of a comparator 12, another input terminal of which is supplied with a reference signal derived from a connection point of a ladder of resistors $R_4$ and $R_5$, which resistors are connected in series with each other and with a constant current source 11, so as to supply the ladder of resistors with a constant current. The last, namely, the eighth order bit of digital signal of binary one figure, which is derived from the comparator 12, is supplied to the output terminal 7, so as to be combined with the sixth and seventh order bits obtained in the upper stage.

In the analog to digital converter 6 which is arranged conventionally as mentioned above, the input analog signal, which has been amplified by the amplifier 5, suffers at least from the problem of DC drift and gain drift caused by the amplifier 5, even if the the effects of similar problems in the preceding converting stages have already been removed. As a result, the input analog signal applied to the comparator 12 can suffer from an excessive shift in signal level, the remedy for which is extremely difficult because of the extremely minute level of the differential analog signal (c) applied to the amplifier 5. Consequently, the last, namely eighth order bit digital signal derived from the analog to digital converter 6 possesses an extremely low accuracy and stability.

In contrast therewith, the present invention is designed to avoid extremely low accuracy and stability in the multi-stage analog to digital converting device having high resolvability by utilizing the aforesaid peculiar property of the input analog signal to be converted in the far lower converting stage.

Figure 10:
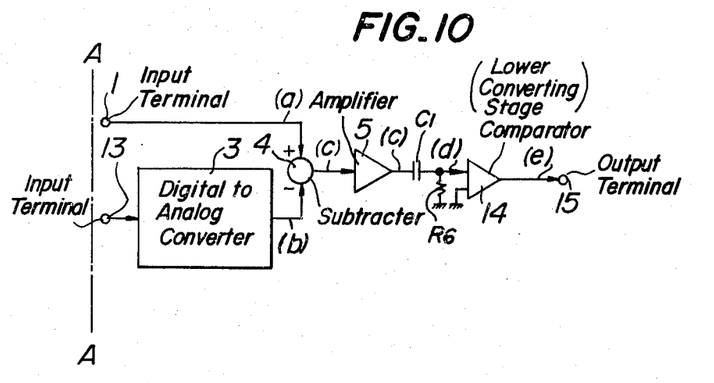
FIG. 10 is a block diagram showing an embodiment of the lowest order or a just preceding converting stage of a multi-stage analog to digital converting device according to the present invention.
Figure 11:
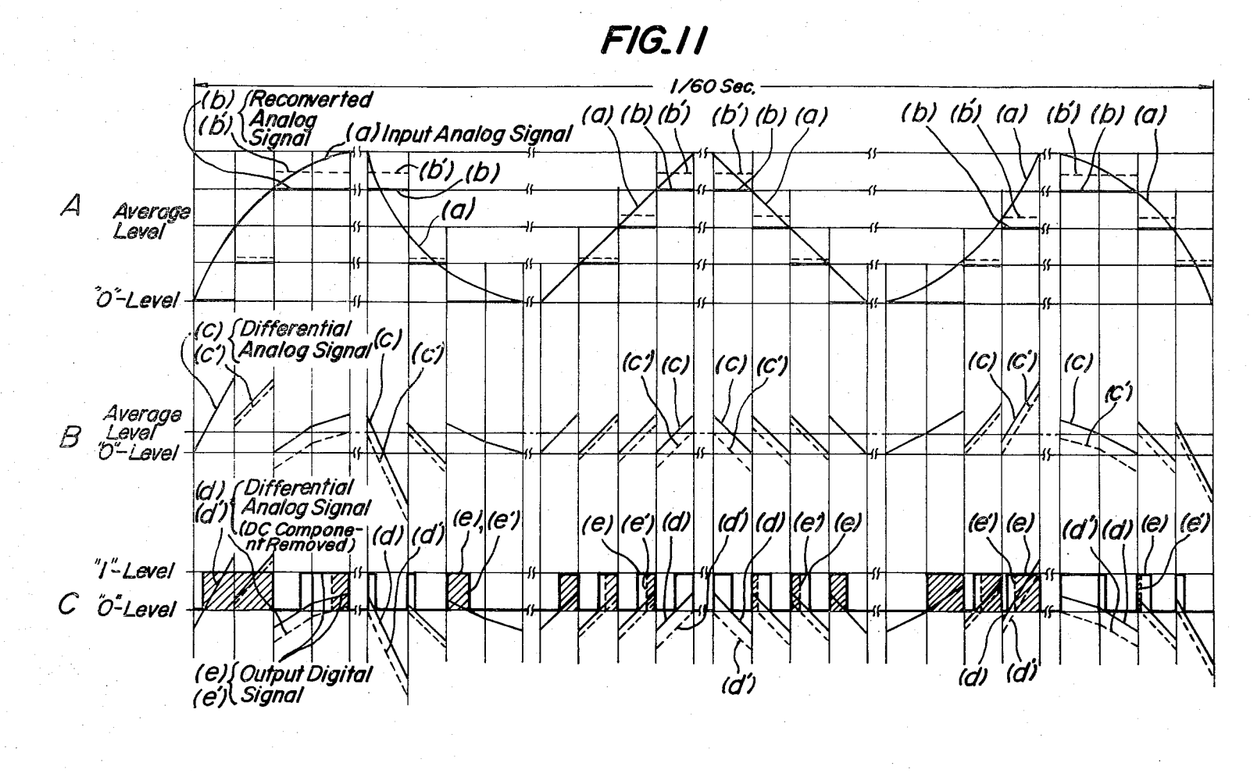
FIG. 11 is a figure showing wave-forms of signals derived respectively from various sections of the embodiment shown in FIG. 10.

FIG. 10 shows a basic configuration of a principal portion of a multi-stage analog to digital converting device according to the present invention, and FIG. 11 shows respective waveforms at various points of the configuration shown in FIG. 10.

As mentioned earlier by referring to the pictures shown in FIGS. 2 to 8, with respect to the multi-bit digital picture signal consisting, for instance, of eight bits, the equivalent analog signals corresponding to the digital components of the lower order than the fifth order bit have waveforms which resemble those of Gaussian distribution, and finally that of the eighth order bit can be regarded almost as that of Gaussian noise.

According to the fact mentioned above, it is assumed that the converting stage wherein the sixth and seventh order bits of the eight-bit digital picture signal are obtained is arranged in the left side of the chain line A—A in FIG. 10, while the configuration arranged on the right side of the chain line A—A corresponds to the last converting stage wherein the eighth, namely, the last order bit of the digital picture signal is formed according to the present invention.

The analog signal supplied to the input terminal 1, which is the input analog signal of the just preceding stage, has the various waveforms (a) as shown in FIG. 11A, which are distributed almost evenly on both sides of the average level in the sufficiently long time duration of, for instance, 1/60 second, that is, a field duration of the television picture, and resemble passably those of the Gaussian distribution. Naturally, the amplitude of the analog signal (a) is smaller than one quantizing step used for analog to digital conversion in the just preceding stage. In the preceding stage arranged for obtaining the sixth and seventh bits of the digital picture signal of eight bits, as shown in FIG. 11A, the input analog signal (a) is quantized successively by referring to the four quantizing steps, so as to be converted into the sixth and seventh order bit digital signal, which digital signal is applied to the digital to analog converter 3 through an input terminal 13. In the converter 3, the applied digital signal is reconverted to an equivalent analog signal, which is held in a time duration equal to the sampling period, so as to obtain the equivalent reconverted analog signal having the discrete waveforms (b) as shown by dashed lines in FIG. 11A. Both of those analog signals (a) and (b) are applied to the subtracter 4 so as to obtain a differential analog signal. Various waveforms of the differential analog signal obtained as described above can be regarded, as shown by waveforms (c) in FIG. 11B, as almost linear respectively with respect to every sampling period, that is, as almost the same to those of the Gaussian distribution. As a result, the DC component of the above-mentioned differential analog signal is equal to a zero-level in the case of the quantization based on the respective mean level of each quantizing step used for digitizing in the converting stage applied with the differential analog signal as an input signal to be converted, while the aforesaid DC component is equal to the level of half of the quantizing step in the case of the quantization based on the respective lowest level of each quantizing step.

The differential analog signal (c) having the waveforms as shown in FIG. 11B is fed from the subtracter 4, through the amplifier 5, to a filtering circuit consisting of a series of capacitor $C_1$ and parallel resistor $R_6$, so as to possess a suitable time constant for removing the DC component from the applied differential analog signal. Accordingly, the differential analog signal derived from the filtering circuit and applied to one of input terminals of a comparator 14, another input terminal of which is grounded, namely, is held on zero level, possesses an average level being equal to zero level, as shown by waveforms (d) in FIG. 11C.

The differential analog signal (d) having the average level of zero is digitized by comparing its level with the reference level of zero, so as to be converted into output digital signals (e) of binary one figure, as shown in FIG. 11C, which correspond to the eighth, namely, the last order bit of the desired digital picture signal of eight bits.

Consequently, even if DC drifts have been caused, for instance, with respect to the converters 2 and 3, the subtracter 4, and the amplifier 5, and further the input analog signal to be converted in the preceding converting stages, the last order bit digital signal obtained in the above-mentioned manner according to the present invention does not suffer at all from the degrading effect of DC drifts caused in the preceding converting stages, so that an output digital signal having extremely high accuracy and stability can be derived from the output terminal 15 in an extremely simple manner.

Figure 12:
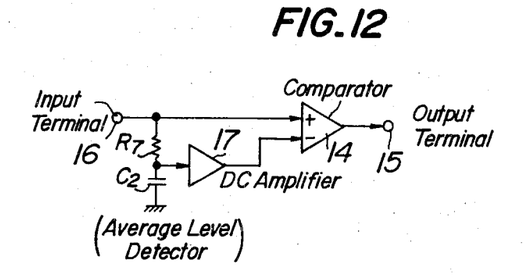
FIG. 12 is a block diagram showing another configuration of a principal portion of the embodiment shown in FIG. 10.

FIG. 12 shows another basic configuration of a principal portion of a multi-stage analog to digital converting device according to the present invention.

In the basic configuration shown in FIG. 12, the differential analog signal (c) derived from the just preceding converting stage, wherein the sixth and the seventh order bits of the desired digital picture signal is obtained similarly as mentioned above in reference to FIG. 10, is supplied at an input terminal 16. The differential analog signal at the input terminal 16 is applied to one of input terminals of a comparator 14 as well as to an average level detector consisting of a resistor $R_7$ and a capacitor $C_2$ which are connected in series with each other and to ground potential, so as to extract an average level of the applied differential analog signal on a connection point. The average level derived from the connection point is applied through a DC amplifier 17 to another input terminal of the comparator 14 as a reference signal for level comparison with the differential analog signal, so as to obtain the eighth, namely, the last order bit digital signal of one binary figure at an output terminal 15 as a result of the level comparison.

The time constant formed by the resistor $R_7$ and the capacitor $C_2$ connected in series with each other as the average level detector, as well as that formed by the capacitor $C_1$ and the resistor $R_6$ shown in FIG. 10, should be selected in such a manner that the average level of the applied differential analog signal (c) can be obtained with respect to the sufficiently long time duration, for instance, 1/60 second equal to one field duration of the television picture, as mentioned earlier.

In the above described configuration shown in FIG. 12, the reference level for level comparison can follow directly the variation of the average level of the differential analog signal applied to one of input terminals of the comparator 14. As a result, even if the DC level of the applied differential analog signal shifts or varies owing to the current absorbed into the input terminal of the comparator 14 which is caused by the low input impedance of the comparator 14, the DC level shift or variation can be cancelled completely by the aforesaid follow-up of the reference level for comparison, which is unlikely in the case of FIG. 10. Moreover, in order to effect the cancellation of the DC level shift or variation sufficiently, the detected average level as the reference for the level comparison is applied to reference input terminal of the comparator 14 through a DC amplifier 17, which has an extremely low output impedance and a gain of one.

Figure 13:
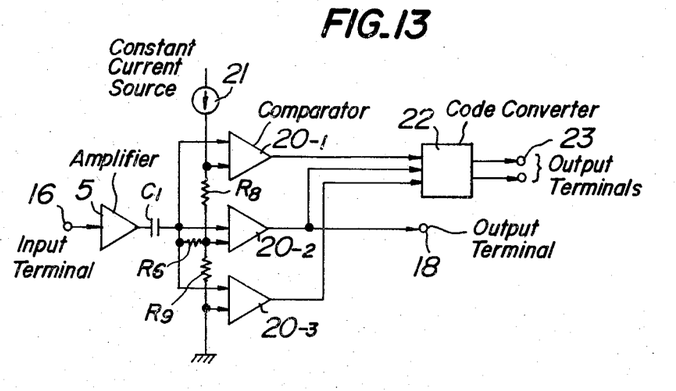
FIG. 13 is a block diagram showing further another configuration of the principal portion shown in FIG. 12.
Figure 14:
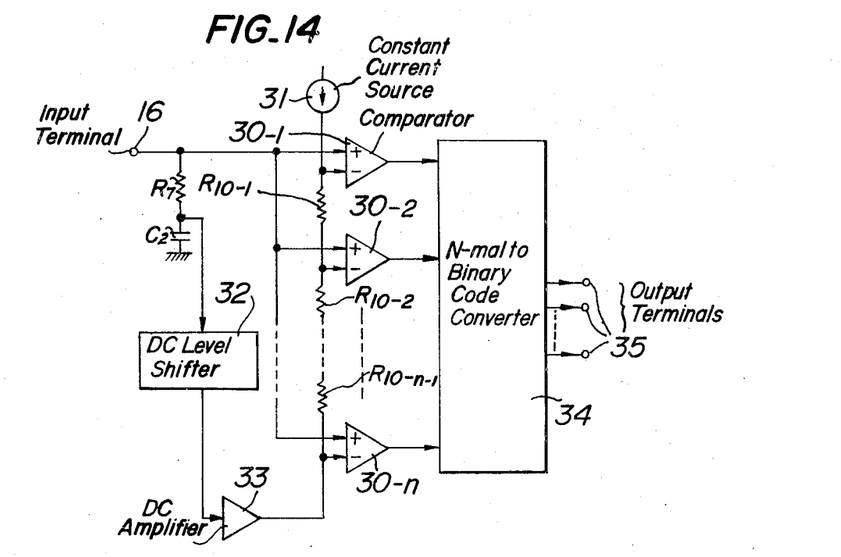
FIG. 14 is a block diagram showing another embodiment of the lowest order or a just preceding converting stage according to the present invention.

FIG. 13 and FIG. 14 show respectively further embodiments of the present invention wherein the far lower order multi-bit digital signal of binary code can be obtained, while the single-bit digital signal of binary one figure is obtained in those shown in FIG. 10 and FIG. 12, which drawings correspond respectively to FIGS. 13 and 14.

In the configuration shown in FIG. 13, the differential analog signal (c) at the input terminal 16 is applied through the amplifier 5 and the filtering circuit consisting of the capacitor $C_1$ and the resistor $R_6$ to respective one of input terminals of three comparators $20_{-1}$, $20_{-2}$ and $20_{-3}$ arranged in parallel. The reference level signals derived respectively from successive connection points of a series connection of a constant current source 21, resistors $R_8$ and $R_9$ and the grounded point are supplied to respective other input terminals of the comparators $20_{-1}$, $20_{-2}$ and $20_{-3}$. The resistor $R_6$ in the filtering circuit is connected to the other input terminal of the comparator $20_{-2}$, whereat the middle reference level is supplied, so that the average level of the applied differential analog signal to be compared in level is clamped on the middle reference level. Accordingly, a multi-bit digital signal of quadal one figure can be derived from the three comparators $20_{-1}$, $20_{-2}$ and $20_{-3}$. The multi-bit digital signal of quadal one figure is converted to that of binary two figures by a conventional code converter 22, and then the converted digital signal is derived from output terminals 23. The output signal of the middle comparator $20_{-2}$ is derived directly from an output terminal 18, and is used for automatic gain control of converters in preceding converting stages as explained later. Furthermore, one of output signals of the three comparators can be used as a carry or borrow signal for the correction of errors of conversion in the preceding converting stages, which errors are caused by the DC drift or the gain drift of circuit components in those stages, so as to improve the accuracy and the reliability relating to those converting stages.

On the other hand, in the configuration shown in FIG. 14, the differential analog signal (c) at the input terminal 16 is applied directly to respective one of input terminals of plural comparators $30_{-1}, 30_{-2} \ldots, 30_{-n}$, as well as to the average level detector consisting of the resistor $R_7$ and the capacitor $C_2$ which are connected in series with each other and to the grounded point, similarly as shown in FIG. 12. The average level derived from the connection point is supplied through a DC level shifter 32 to a DC amplifier 33. The respective reference levels derived for the level comparison respectively from successive connection points of a series connection of a constant current source 31, plural resistors $R_{10-1}, R_{10-2}, \ldots, R_{10-n-1}$, and an output terminal of the DC amplifier 33 are applied to respective other input terminals of the comparators $30_{-1}, \ldots, 30_{-n}$. The respective reference levels are based on the average level of the applied differential analog signal, so as to follow the variation of the DC level of the applied differential analog signal. Accordingly, a multi-bit digital signal of n-mal one figure can be derived from those plural comparators $30_{-1}, 30_{-2}, \ldots, 30_{-n}$. The multi-bit digital signal of n-mal one figure is converted to that of binary $\log_2 n$ figures by a n-mal to binary code converter 34, and then the converted digital signal is derived from output terminals 35.

By the way, the above-mentioned supply of the average level detected by the average level detector consisting of the resistor $R_7$ and the capacitor $C_2$ through DC level shifter 32 is effected for the purpose of positioning the average level of the applied differential analog signal on the middle point of the dynamic range of the analog to digital converter consisting of the plural comparators $30_{-1}, \ldots, 30_{-n}$ by means of shifting the average level relatively by an appropriate amount corresponding to the discrepancy of level caused by supplying the average level to the bottom of the ladder of the resistors $R_{10-1}, \ldots, R_{10-n-1}$ which is used for settling the aforesaid dynamic range.

Figure 15:
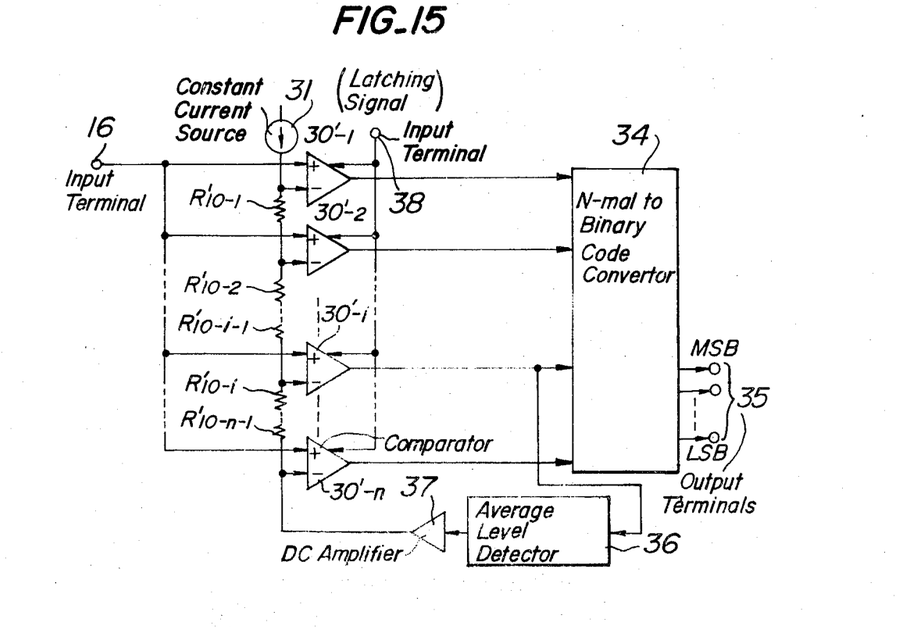
FIG. 15 is a block diagram showing further another embodiment of the lowest order or a just preceding converting stage according to the present invention.

FIG. 15 shows further another embodiment of the present invention wherein the reference level signals used for the level comparison effected by the analog to digital converter in the far lower stage, which consists of plural comparators arranged in parallel similarly as shown in FIG. 14, is formed in such a manner as by a kind of feedback.

The input analog signal to be converted in the lower stage is the resultant differential analog signal obtained by the successively level comparisons effected in the preceding upper stages for every sampling period of the sampled input analog signal, so that so-called glitches, namely, whisker-like distortions are apt to be caused on edges on both sides of waveforms of the input analog signal in the lower converting stage at every sampling period. Accordingly, in case the input analog signal is accompanied periodically by such glitches, the average level derived from the average level detector provided with the CR time constant as shown in FIGS. 12 and 14 cannot help containing the discrepancy of level caused by the glitches.

In the configuration shown in FIG. 15, in order to avoid the aforesaid level error so as to obtain the correct average level, the analog to digital converter in the lower converting stage consists of plural latched comparators $30'_{-1}, 30'_{-2}, \ldots, 30'_{-n-1}$, which are controlled by a latching signal applied periodically from an input terminal 38 in relation to the aforesaid sampling period, so as to hold respective output levels of the latched comparators as those are, even if the input differential analog signal applied to those comparators is varied in level when the level of the latching signal applied to those comparators is high, that is "1". Consequently, the aforesaid periodic glitches can be avoided completely, so as to effect the correct level comparison relating to the proper input differential analog signal to be converted.

The output signal derived from the comparator $30'_{-i}$ positioned on the center of those comparators arranged in parallel is fed to an average level detector 36. The average level derived from the detector 36 is applied to the bottom of the ladder of resistors $R_{10-1}, \ldots, R_{10-n-1}$, at the top whereof the constant current source 31 is connected similarly as shown in FIG. 14, through a DC amplifier 37, so that the conversion error caused by the aforesaid glitches can be removed throughly, by means of enabling the accurate level comparison by referring to the correct reference levels based on the correct average level.

Moreover, in contrast with the case relating to FIG. 14, the DC level shifter 32 is not required because of the adopted feed-back configuration.

Figure 16:
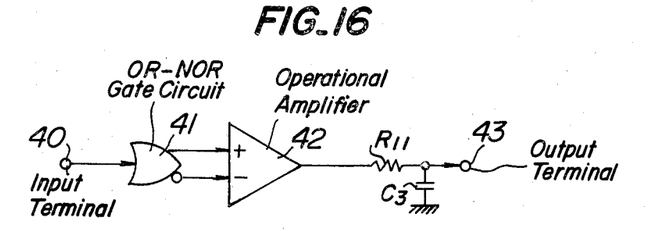
FIG. 16 is a block diagram showing an example of an average level detector used in the embodiment shown in FIG. 15.

FIG. 16 shows an example of the average level detector 36 shown in FIG. 15, the detected output signal of which corresponds to the zero level, when the respective probabilities whereby the output level of the centered comparator $30'_{-i}$ becomes high, namely, "1" and low, namely, "0" respectively are equal to each other.

In the configuration of the average level detector shown in FIG. 16, the output signal supplied from the comparator $30'_{-i}$ at an input terminal 40 is applied to an OR-NOR gate circuit 41, which consists of a conventional integrated circuit, for instance, of the type MC10101 manufactured by the Motorola Inc. in the United States, and wherein two kinds of output digital signals, the polarities of which are the same and opposite to that of the input digital signal can be obtained at two kinds of output terminals respectively, so that, "1" and "0" at the output terminals can be replaced with each other in response to "1" or "0" of the input digital signal. Those output digital signals of the OR-NOR gate circuit 41 are applied to respective input terminals of an operational amplifier 42, which acts as a kind of extremely stable differential amplifier, so as to obtain a differential signal between two input digital signals as an output, the polarity of which turns over in response to the replacement of "1" and "0" in the input digital signals. The aforesaid differential signal is applied to an integrating circuit consisting of a resistor $R_{11}$ and a capacitor $C_3$ so as to obtain an average with regard to time of the applied digital signals, which average with regard to time becomes a value corresponding to the zero level, in case the distribution of "1" and "0" in the input digital signal at the input terminal 40 is balanced with each other.

The above mentioned procedure for detecting the average of digital signals is quite different from that for detecting the average of analog signals as described earlier in relation to the configurations shown in FIGS. 12 and 14. However, with respect to the fact that the average with regard to time of the respective signals coincides almost with the average probability of distribution of the respective signals, both of those procedures for detecting the average can be regarded as that being similar to the so-called "Ergode" theorem. Consequently the procedure for detecting the average relating to the configuration shown in FIG. 15 and those relating to the configurations shown in FIGS. 12 and 14 can be regarded as being substantially the same.

By the way, in the configuration shown in FIG. 15, the output signal of one of the plural comparators is used directly as the input signal applied to the average level detector 36, while the most significant digit MSB, that is, the highest order bit of the binary code signal derived from the code converter 34 which is applied with the respective output signals of the plural comparators can be utilized as the input signal to be applied to the average level detector 36.

In the embodiments of the present invention shown in FIGS. 14 and 15, the average level of the input analog signal to be converted in the far lower converting stage is settled on the center of the dynamic range of the analog to digital converter consisting in the far lower stage. However, according to the procedure of the analog to digital conversion, the dynamic range of the analog to digital converter can be arranged asymmentrically with regard to the average level of the input analog signal to be converted by the aforesaid converter.

The above-mentioned asymmetrical arrangement of the dynamic range can be performed by means of varying the amount of level shift effected by the DC level shifter 32 consisting in the configuration shown in FIG. 14, or, by means of applying the output signal of the comparator of the appropriate order selected from the plural comparators $30'_{-1}, \ldots, 30'_{-n}$ which correspond to the dynamic range successively to the average level detector 36 consisting in the configuration shown in FIG. 15. Moreover, the above-mentioned asymmetric arrangement of the dynamic range can be performed also by means of applying the average level detected by the detector 36 through a DC level shifter to the bottom of the ladder of resistors $R_{10-1}, \ldots, R_{10-n-1}$ of the configuration shown in FIG. 15.

The analog to digital conversion of high resolvability performed by the multi-stage converting device according to the present invention as described above can be improved to a great extent in accuracy and stability in the following manner.

With reference to the configuration shown in FIG. 10, if the conversion gain of the digital to analog converter 3 for reconverting the output digital signal of the sixth and seventh order bits derived from the just preceding stage to the equivalent analog signal is incorrect, and a favorable balance in level cannot be obtained between the input analog signal (a) for the just preceding stage and the aforesaid reconverted equivalent analog signal (b), both of which should be applied to the subtracter 4, the differential analog signal (c) derived from the subtracter 4 becomes incorrect in level owing to the unbalance. In such a case, that is, when the conversion gain of the digital to analog converter 3 is incorrect, the output signal level of the digital to analog converter 3 obtained in response to a quantized level of the first step shown by a solid line in FIG. 11A, namely, to the zero level derived from the input analog signal (a) does not vary at all, while that obtained in response to quantized levels of the second step and so on vary owing to the unbalance. For example, in case the conversion gain of the converter 3 exceeds the appropriate value, the reconverted equivalent analog signal having the variously shifted levels as shown by dashed lines (b') in FIG. 11A is obtained. Consequently, the differential analog signal derived from the subtracter 4 also possesses variously shifted levels as shown by dashed lines (c') in FIG. 11B.

As a result of this, the level shift of the differential analog signal (c) in FIG. 11B, which level shift is caused by the inappropriate conversion gain of the digital to analog converter 3 and is varied in response to the quantized signal level of the input analog signal (a), brings about a further level shift as shown by a dashed line (d') to the alternating component (d) of the differential analog signal (c), which component is shown in FIG. 11C and is applied to the comparator 14, according to the relation between the time interval of the amplitude variation of the input analog signal (a) and the time constant of the filtering circuit which consists of the series capacitor $C_1$ and the parallel resistor $R_6$.

In connection with the above mentioned level shift of the alternating component (d') of the differential analog signal (c'), the output digital signal (e) derived from the comparator 14 is substituted by an erroneous output digital signal (e') as shown by shaded portions in FIG. 11C.

Consequently, owing to the instability of the conversion gain of the digital to analog converter 3 and further to the gain or DC drift of other circuit components the conversion error is apt to be caused at least in the lowest order bit of the output digital signal.

Figure 17:
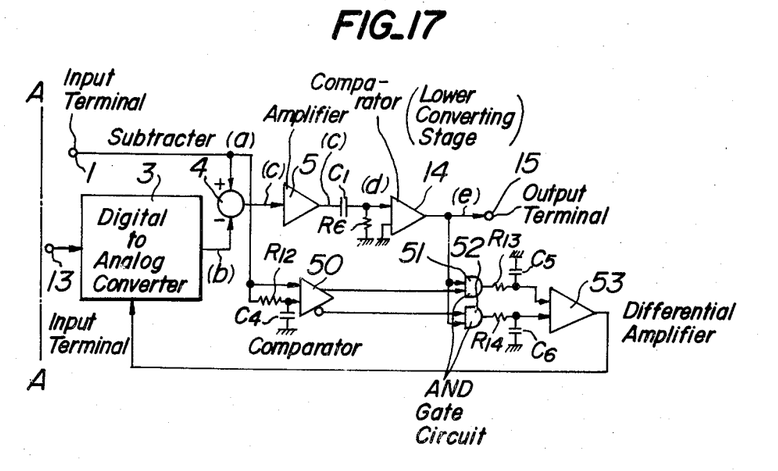
FIG. 17 is a block diagram showing a still further embodiment of the lowest order or a just preceding converting stage of the multi-stage analog to digital converting device according to the present invention.

FIG. 17 shows a still further embodiment of the present invention, wherein the above-mentioned error of conversion caused by the incorrect conversion gain of the digital to analog converted and the instability of gain or DC level in circuit components can be avoided.

In the configuration shown in FIG. 17, the input analog signal (a) at the input terminal 1 and the digital signal supplied from the just preceding stage at the input terminal 13 are processed similarly to that employed in the configuration shown in FIG. 10, so as to obtain the output digital signal (e) of the last order bit at the output terminal 15. Furthermore, the input analog signal (a) is applied to one of input terminals of a comparator 50 directly, as well as to the other input terminal of the comparator 50 through an integrating circuit consisting, for instance, of a series resistor $R_{12}$ and a parallel capacitor $C_4$, provided with an appropriate time constant so as to obtain the average level of the input analog signal (a) by means of smoothing. In the comparator 50, the successive levels of the input analog signal (a) are compared with the average level obtained as mentioned above, so as to discriminate on which side of the average level the levels of the input analog signal (a) are situated successively. The positive output signals and the negative output signals derived separately from the comparator 50 are applied respectively to respective one of input terminals of AND gate circuits 51 and 52, whilst the aforesaid erroneous output digital signal (e') derived from the ordinary comparator 14 is applied to both of respective other input terminals of the AND gate circuits 51 and 52. In these AND gate circuits 51 and 52, the successive rectangular waves of the erroneous output digital signal (e') gate respectively the positive and negative output signals derived from the comparator 50. The gated output signals of those AND gate circuits 51 and 52 are smoothed out respectively by integrating circuits consisting respectively of a resistor $R_{13}$, a capacitor $C_5$ and a resistor $R_{14}$, a capacitor $C_6$, the time constants thereof being sufficiently large, so as to obtain two DC voltages, which are in proportion respectively to the respective sums of the time durations wherein the rectangular waves of the erroneous output digital signal (e') are "1" in respective cases that the successive levels of the input analog signal (a) are situated beyond the average level and are situated below the average level respectively. Those two DC voltages are applied respectively to either one of input terminals of a differential amplifier 53 so as to obtain the differential DC voltage. The differential DC voltage derived from the differential amplifier 53 is fed back to the aforesaid digital to analog converter 3, so as to control the conversion gain of the converter 3 into the appropriately prescribed value. As a result of the aforesaid feed-back control of the conversion gain in such a manner that the above-mentioned respective sum of the time durations are equal to each other, the differential analog signal (d') to be converted is forced to be distributed equally on both sides of the average level, so that the aforesaid error of conversion can be removed, regardless of the level shift of either one of the analog signals applied to the subtracter 4.

In order to perform the above-mentioned improvement in the other basic configuration shown in FIG. 13, the comparator $20_{-2}$ which is positioned at the centre of the plural comparators arranged in parallel can be used both as an ordinary level comparator provided for the conversion and as the aforesaid comparator 50 provided for the feed-back control of the conversion gain, in such a manner that the output signal derived from the comparator $20_{-2}$ is drived from the output terminal 18, so as to be used for the control of the conversion gain of the aforesaid converter 3.

By the way, an additional comparator can also be used exclusively for the feed-back control of the conversion gain in the basic configuration shown in FIG. 13.

The configuration of the far lower order converting stage of the multi-stage analog to digital converting device according to the present invention is not restricted at all to the embodiments shown in the aforesaid drawings. Various modifications can be naturally made, if required, so far as it is enabled to discriminate on which side of the average level the input analog signal to be converted is situated in the far lower order converting stage.

Moreover, in case the analog to digital converter 2 in the configuration shown in FIG. 1 is regarded as a conventional ready-made multi-stage analog to digital converting device, and the portion on the right side of the chain line A—A of the configuration shown in FIG. 1 is regarded as an additional device manufactured according to the present invention, the additional device can be arranged just similarly as shown, for instance, in FIG. 10, simply by means of applying the input analog signal for the conventional device and the overall output digital signal of the conventional device as the signals to be applied respectively to the input terminals 1 and 13, regardless of the configuration of the conventional device.

Moreover, by virtue of applying the feed-back control of the conversion gain of the digital to analog converter as shown in FIG. 17 to the conventional device having the inferior stability of the conversion gain, it is possible to obtain an overall output digital signal having high accuracy.

As a result of the above-mentioned modification, the conventional ready-made multi-stage analog to digital converting device can be improved extremely easily into that provided with further high resolvability and extremely high accuracy and stability. Moreover, in the aforesaid modification, the differential analog signal to be converted in the lowest order stage of the ready-made device is not utilized as the signal to be applied to the input terminal 1 of the additional device in contrast with the configuration shown in FIG. 10, but the original analog signal to be converted is applied to the input terminal 1 shown in FIG. 10, and then the differential analog signal between the original analog signal and the equivalent analog signal reconverted from the overall output digital signal derived from the ready-made device is converted to the additional bits of the output digital signal by referring to the average level of the differential analog signal itself. So that, even if the errors of the conversion are caused in the ready-made device by the DC or gain drift of any converting stages, those errors of the conversion can be corrected as a whole in the additional device according to the present invention, so as to obtain the accurate output digital signal of further high resolvability.

Clearly as explained above, in accordance with the present invention, an analog to digital converting device provided with high resolvability enabled by means of quantizing an analog signal minutely, so as to convert it into a multi-bit digital signal, can be extremely simplified in configuration and manufactured extremely easily in contrast with a conventional device, and moreover the conventional device can be provided with further high resolvability by extremely simple means of adding further converting stages having extremely simplified configuration in comparison with conventional converting stages wherein a complicated configuration consisting of extremely stable circuit components is required especially for the far lower order conversion.

What is claimed is:

1. An analog to digital converting device comprising a plurality of analog to digital converting stages connected in cascade for converting an input analog signal to a digital signal consisting of a plurality of bits, a far lower order for converting stage of said plurality of analog to digital converting stages comprising
    a plurality of comparators for comparing an input analog signal with a respective reference level;
    a resistor ladder comprising a plurality of resistors connected successively with one another and with a constant current source in series for supplying said comparators with respective reference levels derived successively from connection points of said resistor ladder;
    an average level detector comprising a series connection of a resistor and a grounded capacitor for detecting the average level of said input analog signal, said average level being derived from a connection point of said series connection;
    a DC level shifter connected between said connection point of said series connection of said resistor and said grounded capacitor of said average level detector and a bottom of said resistor ladder for shifting said average level derived from said connection point to a level which corresponds to one of said respective reference levels derived successively from said connection points of said resistor ladder, and a code converter provided for converting successive output signals derived from said plurality of comparators to a binary code digital signal.

2. An analog to digital converting device as claimed in claim 1, wherein said one of said respective reference levels which corresponds to the level to which said average level is shifted, is a center-most reference level.

* * * * *